US010635967B2

(12) United States Patent
Aparicio, IV

(10) Patent No.: US 10,635,967 B2
(45) Date of Patent: Apr. 28, 2020

(54) METHODS, SYSTEMS AND COMPUTER PROGRAM PRODUCTS FOR NEUROMORPHIC GRAPH COMPRESSION USING ASSOCIATIVE MEMORIES

(71) Applicant: Intel Corporation, Santa Clara, CA (US)

(72) Inventor: Manuel Aparicio, IV, Chapel Hill, NC (US)

(73) Assignee: Intel Corporation, Santa Clara, CA (US)

( * ) Notice: Subject to any disclaimer, the term of this patent is extended or adjusted under 35 U.S.C. 154(b) by 545 days.

(21) Appl. No.: 14/687,063

(22) Filed: Apr. 15, 2015

(65) Prior Publication Data

US 2015/0294217 A1    Oct. 15, 2015

Related U.S. Application Data

(60) Provisional application No. 61/979,601, filed on Apr. 15, 2014.

(51) Int. Cl.
*G06N 3/04* (2006.01)
*G11C 15/00* (2006.01)

(52) U.S. Cl.
CPC ........... *G06N 3/049* (2013.01); *G11C 15/00* (2013.01); *G06N 3/0445* (2013.01)

(58) Field of Classification Search
CPC .................................................. G06N 3/049
See application file for complete search history.

(56) References Cited

U.S. PATENT DOCUMENTS

| 4,660,166 A | 4/1987 | Hopfield |
| 5,255,348 A | 10/1993 | Nenov |
| 6,052,679 A | 4/2000 | Aparicio, IV et al. |
| 6,581,049 B1 | 6/2003 | Aparicio, IV et al. |
| 7,016,886 B2 | 3/2006 | Cabana et al. |
| 7,657,496 B2 | 2/2010 | Aparicio, IV |

(Continued)

FOREIGN PATENT DOCUMENTS

JP    08-123885 A    5/1996

OTHER PUBLICATIONS

Herz, Andreas VM, et al. "Modeling single-neuron dynamics and computations: a balance of detail and abstraction." science 314. 5796 (2006): 80-85.*

(Continued)

*Primary Examiner* — Vincent Gonzalez
*Assistant Examiner* — Kevin W Figueroa
(74) *Attorney, Agent, or Firm* — Barnes & Thornburg LLP

(57) ABSTRACT

Methods, systems and computer program products memorize multiple inputs into an artificial neuron that includes multiple dendrites each having multiple dendrite compartments. Operations include computing coincidence detection as distal synapse activation that flows from more proximal ones of the dendrite compartments to a soma of the artificial neuron, generating a dendritic action potential responsive to the coincidence detection from a non-zero activation value input received at a corresponding one of the dendrite compartments that includes a non-zero receptivity, and responsive to generating the dendritic action potential, decrementing the activation value and the receptivity and passing the decremented activation value to a next one of the dendrite compartments.

6 Claims, 9 Drawing Sheets

(56) References Cited

U.S. PATENT DOCUMENTS

| | | | |
|---|---|---|---|
| 8,352,488 B2 | 1/2013 | Fleming et al. | |
| 2007/0299797 A1* | 12/2007 | Aparicio, IV | G06N 3/0445 706/17 |
| 2010/0312735 A1* | 12/2010 | Knoblauch | G06N 3/0445 706/25 |
| 2013/0046716 A1* | 2/2013 | Chan | G06N 3/088 706/18 |
| 2013/0198121 A1* | 8/2013 | Modha | G06N 3/04 706/26 |

OTHER PUBLICATIONS

Rachmuth, Guy, et al. "A biophysically-based neuromorphic model of spike rate-and timing-dependent plasticity." Proceedings of the National Academy of Sciences 108.49 (2011): E1266-E1274. (Year: 2011).*

Notice of Reasons for Rejection and English Translation for Japanese Patent Application No. 2016-555836, dated Aug. 15, 2017, 4 pages.

U.S. Appl. No. 61/896,258, filed Oct. 28, 2013 to Hofmann et al.

U.S. Appl. No. 61/904,835, filed Nov. 15, 2013 to Hofmann et al.

Second Office Action dated Nov. 20, 2018 for Chinese Patent Application No. 201580014704.7, including translation (14 pages).

European Office action in European patent application No. 15720120.3, dated Feb. 14, 2019 (7 pages).

International search report for PCT application No. PCT/IB2015/052757, dated Sep. 15, 2015 (3 pages).

Written opinion for PCT application No. PCT/IB2015/052757, dated Sep. 15, 2015 (7 pages).

First Office Action dated May 28, 2018 for Chinese Patent Application No. 201580014704.7, including translation (13 pages).

Office Action dated Feb. 20, 2018 for Korean Patent Application No. 10-2016-7025081, including machine translation (22 pages).

Herz, Andreas VM et al, "Modeling single-neuron dynamics and computations: a balance of detail and abstraction," Science 314, 80 (2006).

Fourth Office Action dated Aug. 20, 2019, for Chinese Patent Application No. 201580014704.7, including machine translation (15 pages).

Third Office Action dated Mar. 20, 2019, for Chinese Patent Application No. 201580014704.7, including machine translation (13 pages).

* cited by examiner

A  B

METHODS, SYSTEMS AND COMPUTER PROGRAM PRODUCTS FOR NEUROMORPHIC GRAPH COMPRESSION USING ASSOCIATIVE MEMORIES

RELATED APPLICATIONS

This non-provisional patent application claims priority to U.S. Provisional Application No. 61/979,601, filed Apr. 15, 2014 and entitled Methods, Systems And Computer Program Products For Neuromorphic Graph Compression Using Associative Memories, the disclosure of which is hereby incorporated herein by reference as if set forth fully herein.

FIELD OF THE INVENTION

This invention relates to knowledge management systems, methods and computer program products, and more particularly to associative memory systems, methods and computer program products.

BACKGROUND

Associative memories, also referred to as content addressable memories, are widely used in the field of pattern matching and identification, expert systems and artificial intelligence. A widely used associative memory is the Hopfield artificial neural network. Hopfield artificial neural networks are described, for example, in U.S. Pat. No. 4,660,166 to Hopfield entitled "Electronic Network for Collective Decision Based on Large Number of Connections Between Signals".

Although associative memories may avoid problems in prior back-propagation networks, associative memories may present problems of scaling and spurious memories. Recent improvements in associative memories have attempted to solve these and other problems. For example, U.S. Pat. No. 6,052,679 to coinventor Aparicio, I V et al., entitled "Artificial Neural Networks Including Boolean-Complete Compartments" provides a plurality of artificial neurons and a plurality of Boolean-complete compartments, a respective one of which couples a respective pair of artificial neurons.

Beyond single-point neuron models of traditional neural networks, real neurons exhibit complex, nonlinear behavior equivalent to networks within themselves. In particular, recent computational neuroscience has focused on understanding the neuron's wiring efficiency and computational power, particularly in how dendrites (structurally linear) compute coincidences (functionally non-linear). However, a computational level of analysis to better understand neuronal dendrites as well as to develop neuromorphic devices has remained elusive. The answer is found by assuming a coincidence matrix (a graph) as the fundamental object of each neuron's memory but without requiring an explicit crossbar as typical of many current neuromorphic efforts. Tomographic projections of each matrix are shown represent a lossless compression, expressible by cascading waves of synaptic activation over a receptivity array of dendritic compartments. This simple activation-passing algorithm is capable of reading and writing graph structures. Such wiring efficiency explains how each neuron represents a nonlinear associative memory and inspires emergent neuromorphic devices to store and compute such memories without the cost of geometric crossbars. Matrix bandwidth reduction adds even greater processing speed, and logical reversibility promises adiabatic energy efficiency. As Cognitive Computing continues to emerge as the basis for machine intelligence, a more brain-like approach will move into operating systems, and will ultimately require wiring and energy efficiencies to support cognition by cognitive hardware.

SUMMARY

Some embodiments of the present invention are directed to methods, systems and computer program products for neuromorphic graph compression using associative memories. Some embodiments are directed to an artificial neuron that includes multiple dendrites, ones of which include multiple dendrite compartments, wherein a respective one of the dendrite compartments is uniquely associated with a respective one of multiple inputs. Each dendrite compartment includes a first weight value corresponding to a synapse activation strength and a second weight value corresponding to receptivity value of the respective dendrite compartment to other activations.

In some embodiments, the dendrite compartments are linearly arranged from an apex that is a distal tip of the dendrite to a soma which is an artificial neuron summation point.

Some embodiments provide that each of the dendrites is a linear array of the dendrite compartments that are configured to receive inputs from respective other artificial neurons.

In some embodiments, ones of the inputs are received via cascading synaptic activation via the plurality of dendrite compartments. Some embodiments provide that dendrite compartments having receptivity values of zero are configured to transmit an activation input from a more distal one of the dendrite compartments as an activation output to a more proximal one of the dendrite compartments.

Some embodiments provide that, responsive to the inputs generating a crossed-switch among ones of the dendrite compartments, the corresponding one of the dendrites includes an added dendrite compartment at the dendrite apex.

In some embodiments, responsive to the first weight value in one of the dendrite compartments being greater than zero and the second weight value in the one of the dendrite compartments being greater than zero, the one of the dendrite compartments sends a coincidence spike signal to a soma that is an artificial neuron summation point.

Some embodiments provide that, responsive to the first weight value in one of the dendrite compartments being zero, activation propagation ceases for that one of the dendrite compartments.

Some embodiments of the present invention include methods of memorizing multiple inputs into an artificial neuron that includes multiple dendrites each having multiple dendrite compartments. Methods may include computing coincidence detection as distal synapse activation that flows from more proximal ones of the dendrite compartments to a soma of the artificial neuron that is an artificial neuron summation point of the artificial neuron.

Some embodiments include generating a dendritic action potential responsive to the coincidence detection from a non-zero activation value input received at a corresponding one of the dendrite compartments that includes a receptivity value that is non-zero. Some embodiments provide that, responsive to generating the dendritic action potential, the activation value and the receptivity value are decremented and the decremented activation value is passed to a next one of the dendrite compartments.

Some embodiments of the present invention include methods of memorizing multiple inputs into an artificial neuron that includes multiple dendrites each having multiple dendrite compartments. Such methods may include computing coincidence detection using a cascading activation that cascades from distal ones of the dendrite compartments more proximal ones of the dendrite compartments to a soma of the artificial neuron, and detecting and avoiding a crossed-configuration 4-switch.

Some embodiments of the present invention include an artificial neuron that includes multiple dendrites, ones of which include multiple dendrite compartments. Some embodiments provide that a respective one of the dendrite compartments is uniquely associated with a respective one of multiple inputs, that ones of the dendrite compartments are configured to receive a cascading activation and to transmit the cascading activation in an unmodified state if the corresponding one of the dendrite compartments includes a first receptivity value and in a modified state that is different from the unmodified state if the corresponding one of the dendrite compartments includes a second receptivity that is different from the first receptivity.

Some embodiments of the present invention are directed to a computer program product for memorizing a plurality of inputs into an artificial neuron that includes multiple dendrites each having multiple dendrite compartments. The computer program product includes a non-transitory computer readable storage medium storing computer readable program code that, when executed by a processor of an electronic device, causes the processor to perform operations including computing coincidence detection as distal synapse activation that flows from more proximal ones of the dendrite compartments to a soma of the artificial neuron, generating a dendritic action potential responsive to the coincidence detection from a non-zero activation value input received at a corresponding one of the dendrite compartments that includes a non-zero receptivity, and responsive to generating the dendritic action potential, decrementing the activation value and the receptivity and passing the decremented activation value to a next one of the dendrite compartments.

Some embodiments of the present invention are directed to methods of memorizing multiple inputs into an artificial neuron that includes multiple dendrites each having multiple dendrite compartments. Such methods may include computing coincidence detection using a cascading activation that cascades from distal ones of the dendrite compartments more proximal ones of the dendrite compartments to a soma of the artificial neuron and detecting and avoiding of crossed-configuration 4-switches.

In some embodiments, the dendrite compartments are linearly arranged from an apex that is a distal tip of a corresponding one of the dendrites to a soma which is an artificial neuron summation point of the corresponding one of the dendrites.

Some embodiments include receiving, into ones of the dendrite compartments, inputs from respective other artificial neurons. In some embodiments, each of the dendrites includes a linear array of the dendrite compartments that are configured to receive the inputs from the respective other artificial neurons. Some embodiments provide that receiving, into ones of the dendrite compartments, inputs from respective other artificial neurons comprises receiving the inputs via cascading synaptic activation via the dendrite compartments.

Some embodiments include transmitting an activation input from a more distal one of the dendrite compartments as an activation output to a more proximal one of the dendrite compartments.

In some embodiments, responsive to the inputs generating a crossed-switch among ones of the dendrite compartments, methods may include providing another dendrite compartment to the dendrites at the dendrite apex.

Some embodiments of the present invention are directed to systems that include a processor and a memory that includes instructions stored therein that, when executed, cause the processor to perform the operations described herein.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

DETAILED DESCRIPTION

Figure 1:
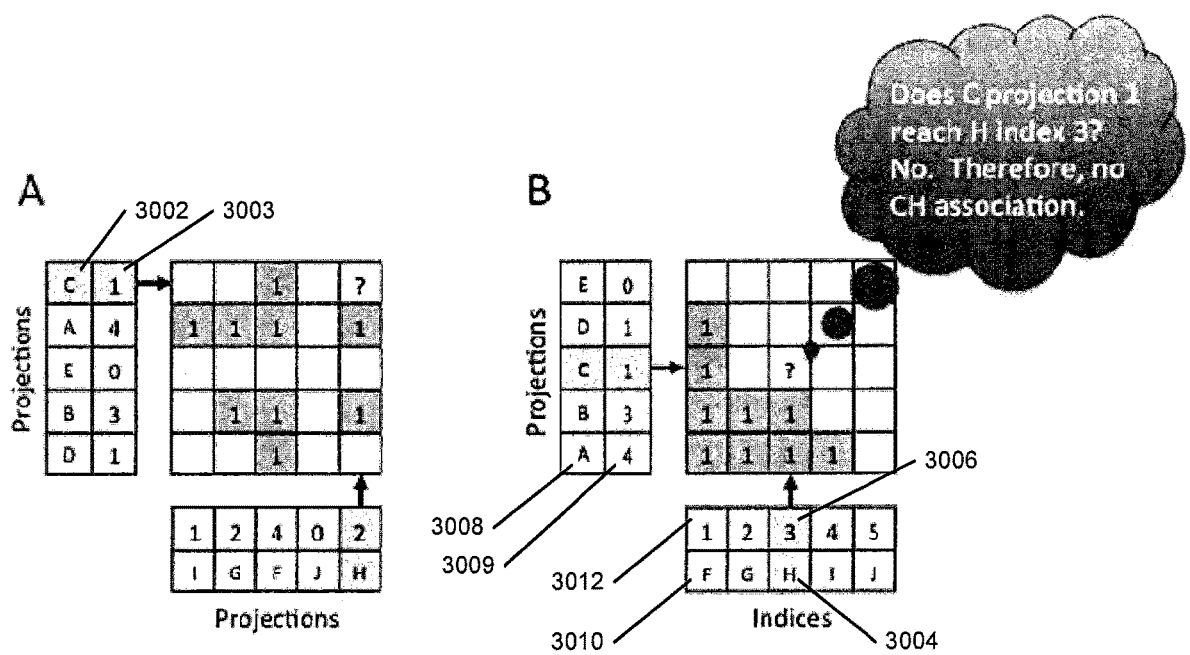
FIG. 1 is a graph illustrating using projections of a maximal matrix according to some embodiments of the present invention.

The present invention now will be described more fully hereinafter with reference to the accompanying drawings, in which illustrative embodiments of the invention are shown. However, this invention may be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "coupled", "connected" or "responsive" to another element, it can be directly coupled, connected or responsive to the other element or intervening elements may also be present. In contrast, when an element is referred to as being "directly coupled", "directly connected" or "directly responsive" to another element, there are no intervening elements present. Like numbers refer to like elements throughout. As used herein the term "and/or" includes any and all combinations of one or more of the associated listed items and may be abbreviated by "/".

It will also be understood that, although the terms first, second, etc. may be used herein to describe various elements, these elements should not be limited by these terms. These terms are only used to distinguish one element from another element.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described in part below with reference to block diagrams and flow charts of methods, systems and computer program products according to embodiments of the invention. It will be understood that a block of the block diagrams or flow charts, and combinations of blocks in the block diagrams or flow charts, may be implemented at least in part by computer program instructions. These computer program instructions may be provided to one or more enterprise, application, personal, pervasive and/or embedded computer systems, such that the instructions, which execute via the computer system(s) create means, modules, devices or methods for implementing the functions/acts specified in the block diagram block or blocks. Combinations of general purpose computer systems and/or special purpose hardware also may be used in other embodiments.

These computer program instructions may also be stored in memory of the computer system(s) that can direct the computer system(s) to function in a particular manner, such that the instructions stored in the memory produce an article of manufacture including computer-readable program code which implements the functions/acts specified in block or blocks. The computer program instructions may also be loaded into the computer system(s) to cause a series of operational steps to be performed by the computer system(s) to produce a computer implemented process such that the instructions which execute on the processor provide steps for implementing the functions/acts specified in the block or blocks. Accordingly, a given block or blocks of the block diagrams and/or flow charts provides support for methods, computer program products and/or systems (structural and/or means-plus-function).

In some embodiments, computer program instructions may be performed by specific hardware as discussed herein that is configured to provide the fine-grained parallelism of simultaneous cascades. For example, some embodiments provide that specific hardware substrates that directly implement one or more computational operations described herein as a part of their intrinsic properties. Non-limiting examples include memristors and their similarity to Hodgkin-Huxley membrane equations may be a basis for implementation.

It should also be noted that in some alternate implementations, the functions/acts noted in the flow charts may occur out of the order noted in the flow charts. For example, two blocks shown in succession may in fact be executed substantially concurrently or the blocks may sometimes be executed in the reverse order, depending upon the functionality/acts involved. Finally, the functionality of one or more blocks may be separated and/or combined with that of other blocks.

In some embodiments, a computational level of analysis to better understand neuronal dendrites as well as to develop neuromorphic devices may be found by assuming a coincidence matrix (a graph) as the fundamental object of each neuron's memory but without requiring an explicit crossbar as typical of many current neuromorphic efforts. Tomographic projections of each matrix are shown to represent a lossless compression, expressible by cascading waves of synaptic activation over a receptivity array of dendritic compartments. This activation-passing algorithm is capable of reading and writing graph structures. Such wiring efficiency may explain how each neuron represents a nonlinear associative memory and inspires emergent neuromorphic devices to store and compute such memories without the cost of geometric crossbars. Matrix bandwidth reduction may add even greater processing speed, and logical reversibility may provide adiabatic energy efficiency. As cognitive computing continues to emerge as the basis for machine intelligence, a more brain-like approach will move into operating systems, and will ultimately require wiring and energy efficiencies to support cognition by cognitive hardware.

Cognitive computing may represent an emerging approach to machine intelligence. Different than historical artificial intelligence (AI), "cognitive" may be defined as more brain-like and more human-like in its representation and reasoning. Unlike historical AI, inspiration from natural systems regards how well our brains are adapted to survive and thrive in the real world in real-time. Moreover, computers are cast as tools to assist humans, and cognitive computing seeks to remove the "impedance mismatch" between current computing and human computing systems. Two cognitive systems will communicate and work together.

If cognitive computing is indeed the answer to machine intelligence, then it will become a fundamental part of computing. "Cognition as a Service" (CaaS) is now being developed, and this trend may continue to provide cognitive services as a key part of computing, whether scaling up to big data services or scaling down to embedded intelligence in "the internet of everything". The brain-like aspects of cognitive computing may drive toward neuromorphic hardware as part of its future.

Several initiatives are already building such brain-like architectures. Several examples include The European Commission's Human Brain Project and DARPA's Systems of Neuromorphic Adaptive Plastic Scalable Electronics (SyNAPSE) project. Their approaches range from very realistic neuron modeling on supercomputers to the development of specialized chips. Goals for the Human Brain Project include understanding the brain itself as well as developing new computing methods from such understanding. The goal of DARPA SyNAPSE is focused on neuromorphic hardware that scales to biological levels, such as to the massive number of neurons and synapses of a mammalian brain.

Many different substrates are being used to implement these neuromorphic approaches, but the theoretical discovery of memristors as a "missing element" of electronics may promise to become a primary substrate for neuromorphic computing. This is in part because of the memristor's similarity to the Hodgkin and Huxley equations, which describe the physiology for neural membrane activity and its propagation. Moving beyond the von Neumann separation of computation from memory and binary logic of transistors, memristors may represent both the non-volatile analog weights of synaptic connections as well as logical operations and spiking behavior. As with real neurons, memristors may be capable of both storing and computing. Furthermore, memristors may provide a substrate that can learn by experience, in the sense that activity can modify stored weights.

Neuromorphic computing is being pursued academically and industrially. Hewlett Packard (HP) was considered the first to implement the "missing element" memristor. The University of Michigan and Hughes Research Lab (HRL) report a CMOS-based neuromorphic memristor in work for DARPA SyNAPSE. Purdue University, in association with Intel Corporation, has demonstrated a spintronic/memristive circuit within a cellular automata design. HP also reports a universal cellular automata of memristors that is Boolean complete. Although not basing its hardware on memristors, IBM is a participant in SyNAPSE for the development of cognitive hardware in which each neuron is called a "corelet".

Larger hardware architectures such as for SyNAPSE include multi-neuron chips and cross-chip communication, in which case the signals between neurons must be routed across these chips. These methods are "neural" in that they include spiking signals and spike-based time multiplexing to connect one neuron to another. All these approaches are basically "neural" in having synaptic connections and weights as fundamental elements. Most of these methods are additionally "neural" in that they tend to include spiking signals to reflect Spike Time Dependent Plasticity (STDP) as well know in neuroscience since Donald Hebb's 1949 Hebbian Learning Rule: "Neurons that fire together, wire together". However, these approaches tend to model the larger scale issues of neuron-to-neuron connectivity, usually including the Address Event Representation (AER) protocol for time-multiplexing between neuron chips. However, they miss the neural point that each neuron is an associative network in itself.

However, no matter the number of neurons or the hardware substrate, the most fundamental problem of neurocomputing may be that all such attempts must ultimately solve how any synaptic input can potentially connect to any other input—without the poor scaling and cost of an explicit crossbar to represent a complete matrix.

The Crossbar Problem

A crossbar may represent every possible input-output connection of an associative matrix. At small scale, inputs and outputs can be hard-wired to each other in a complete matrix. For example, early patent filings for using the memristor were defined by crossbars. Additionally, each neuron "corelet" in IBM's approach as well as the Michigan/HRL approach are represented as crossbars.

The IBM "corelet" architecture attempts to solve the crossbar problem with spike-based multiplexing. However, two levels of network organization are to be distinguished, namely, between neurons and within neurons. Regarding network organization between neurons, each neuron's axonal output can reach out to 1000 other neurons. In a network of millions and billions of neurons, how do the neurons efficiently connect and communicate with each other? Regarding network organization within neurons, each neuron's input can include 10,000 or even 100,000 synapses from other neurons. How do these inputs efficiently interact with each other a within-neuron computation?

For digital computing, the nano-scaling of molecular crossbars has been pursued for many decades, and indeed, when 1s and 0s tend to be uniformly distributed, the nano-scaling of wires and connections will miniaturize digital computing beyond the impending limits of Moore's Law. However, a crossbar scales geometrically with the number of inputs and becomes physically inefficient across a growing number of inputs when applied to cognitive computing. The first issue must also be addressed (as it is) for large-scale systems, but the latter question remains open and is more fundamental. The addition of nano-molecular wires will not solve this within-neuron crossbar problem. The nano-scale molecular crossbars have been pursued over the last decade (Chen et al., 2003), and indeed for digital computing, when 1s and 0s tend to be uniformly distributed in a binary data code, the nano-scaling of wires and connections will eliminate transistors to move beyond the impending limits of Moore's Law. However, when applied to cognitive computing, a geometric crossbar becomes physically inefficient across a growing number of sparsely interconnected triplet interactions. If each post neuron receives tens of thousands of pre inputs and these pre inputs interact (beyond simplistic summations), then the coincidence matrix between these inputs can become hyper-sparse, meaning that a very small fraction of the crossbar will contain 1s while hundreds of millions of crossbar connections will be vastly wasted when containing 0s.

A within-neuron crossbar memory continues to be a challenge of understanding neuron computation and emulating neurons in hardware. Given one neuron, emulation may address how the neuron learns the associations of its inputs to each other across a very large input field. In other words, if the neuron represents a coincidence matrix, emulation may address how dominantly linear structure of the coincidence matrix is not a crossbar of all its connections to each other.

Cellular Neural Networks (CNNs) are similar to neural network connectionism but may be distinguished by local-only neighborhood connections. More recently, approaches may include the design of such a CNN automata in which interactions are local and propagating. Moving beyond initial memristor crossbar designs, HP also more recently reports a neuromorphic device within a linear array rather than a crossbar. Although the HP report demonstrates only 6 cells and discounts the universal computing property of the particular automata rule that was applied, this "proof in principle" demonstrates a non-trivial computation in a one-dimensional array. CNNs of more dimensions have been developed, but a one-dimensional CNN better represents neural dendrites as thin, linear structures.

The neuroscientific and computational research of STDP may be informative. A delay line between pre-synaptic (pre) and post-synaptic (post) spiking may be the central requirement for STDP to represent before-after contingencies. Known as "contiguity", a stimulus must occur before a response to ensure that the stimulus can predict the response. Although many other forms of STDP have been found including reverse contiguity, some form of "time dependency" may be essential to STDP. However, axonal spiking to transmit from one neuron to another is not so simple within the neuron. Although dendritic spiking is also known, synaptic potentiation is found without spiking behavior. More interestingly, in vivo studies show that pairwise pre and post spiking does not reliably invoke synaptic potentiation, the increase of the synaptic weight of an association. Beyond the association of the pre input to the post output as a paired coincidence, a triplet or polysynaptic STDP is being more successfully explored as the actual mechanism of neural learning. A triplet of signals interacts within the neuron—across a thin dendrite. There are many forms of triplet signaling, but here, it is assumed to represent how at least two pre-synaptic inputs interact within the context of the post-synaptic neuron, computing the exact associations of a crossbar with an explicit crossbar.

A solution to the within-neuron crossbar problem may be found in the computation of real neurons and the neuroscientific search for how they detect coincidences over thin dendrites. Many neurons can be wired together, but if the unit of computation—the neuron itself—is wrong and inefficient, larger architectures miss the neuron point.

Coincidence Detection

Since the re-birth of "neural networks" in the 1980s, neuroscience has criticized most computational algorithms as having little or nothing to do with real neurons. For example, the Parallel Distribute Processing (PDP) approach assumed that neurons were weak and slow, saved only by their parallelism and massive number. In contrast, neuroscience has increasingly discovered the highly non-linear behavior of individual neurons. In addition to neurons forming a network with each other, each single neuron may represent a network in itself. This deeper approach to neural computation arose most strongly in the 1990s, articulated by McKenna and Davis' *Single Neuron Computation* in 1992 and epitomized in Christof Koch's *Biophysics of Computation: Information Processing in Single Neurons* in 1998. Years of neural research since have included a focus on this unit of computation especially to understand the neuron's miniaturization of wiring and energy. If neurons are powerful nonlinear devices, then their dendrites, where synapses connect to the neuron and seem to interact with each other, must be key to their computation.

The neuron's solution to the crossbar's wiring problem has been cast as the search for what has been defined as "coincidence detection" on thin dendrites as a central question about single neuron computation. In other words, it may be desirable to know how synaptic inputs detect other synaptic inputs within the dendrite. However, many models exist for more simplistic definitions of "coincidence detection". This phrase may have various meanings aside from the one intended here to solve the crossbar problem.

One example is binaural sound localization. Given two ears, sound arrives slightly later to one ear. The two activations of the two inputs are thought to coincide, and the neural point at which they coincide marks the sound's direction. Some models include delay lines to detect when the two signals meet each other as indicating a sound's location. As such, sound localization is not a matter of learning.

Another example is pre- and post-synaptic firing. The simplest definition for learning involves the coincident firing of two neurons connected by one synapse. Coincidence activation is thought to be the basis for change in the synaptic weight. This represents learning as "Cells that fire together, wire together". One synapse, one weight schemes only represent pair-wise associations, in contrast with the present invention, which allows triple associations in which two inputs interact with a given output.

Yet another example includes single vector matching. Some distributed representations assign one prototype vector to each neuron. Similar to a sparse distributed memory, the node detects a closest match if its inputs match the vector. For example, some theories predict that pyramidal neurons are coincidence detectors. However, such models may define that coincidence detection is limited by a fixed-sparsity distributed representation in which each dendrite stores only one vector point and not a full associative matrix.

The first definition may represent only two inputs to compute a location and not a learned association. The second definition may represent the learning of a single association between one input and another neuron. The third definition may be intended to support a more powerful associative memory of input vectors, but each neuron represents only one vector, not an arbitrary coincidence matrix of many vectors.

To avoid confusion, the assumed computation should be more clearly defined. Coincidence detection within each neuron is assumed to represents an entire matrix, an entire graph, within itself. In this definition, the neural dendrite represents many arbitrary associations between its inputs. How to represent an arbitrary non-linear network structure within a dominantly linear "thin dendrite" becomes desirable. Toward understanding neurons as well as for efficient neuromorphic devices, an algorithm may be beneficial. The inspiration for such algorithm may be sought from real neurons.

As a CNN, an algorithm should be a hardware algorithm. The neuron is a device, even if in "wetware" rather than hardware, utilizing very fine-grained parallelism across its physical structure. Such device-level parallelism can be simulated in software as much as software can simulate any electronic circuit, but the computation is effectively found by reasoning about the neuron as a device per se. It may be helpful to consider how to distinguish different levels of analysis for neurocomputation.

A computational theory level of analysis may determine the goal of the computation, why that goal is appropriate, and the logic of the strategy for accomplishing the goal. A representation and algorithm level of analysis may determine how the computational theory may be implemented, and, in particular, what representation is used for the input and output, and what algorithm is used for the transformation. A hardware implementation level of analysis may determine how can the representation and algorithm may be realized physically.

Independent of the physical substrate, memristor or not, the computation and specific algorithm may be needed first. Given the computational assumption that each neuron can learn and recall an associative matrix (a graph or network in itself), determining the algorithms of transformation for learning and recollecting are desirable.

Computational Analysis

As disclosed herein, a dominantly linear dendritic process may learn any arbitrary coincidence structure across its distributed synaptic inputs and dendrites may store graphs in and of themselves. At a computational level of analysis, graphs can be cast as Boolean functions. For example, a linear structure can compute Boolean functions either in conjunctive or disjunctive normal form, depending on two different strategies for the neural algorithm. In both cases, each synaptic input may be assigned 2 separate weights along the dendritic array, rather than the usual single weight of traditional neural network models. These computations appear to be biologically plausible by a simulation of Hodgkin-Huxley equations to represent these weights and their algorithmic propagation. The report of both algorithmic strategies includes uncertainties for a complete computation. One uncertainty corresponds to Boolean incompleteness at larger scale. For 3 and 4 input variables, the algorithm can represent all Boolean functions, but as the number of inputs increase, the number of Boolean functions grows exponentially and the method's coverage of these functions decreases exponentially. On the other hand, it has theoretically been proven that any Boolean network function is computable with enough dendritic compartments. Another uncertainty to a proof of existence that Boolean functions may be computed but does not identify a method to learn the weights. For example, given the design of two weights per input, Boolean functions were generated and tested by exhaustive search of the weight space. This result proves that a pair of weight for each input can compute Boolean functions, but there is no reported method to learn these weights.

A two-weights-per-input scheme computes interesting functions while also being neuro-realistically computed by Hodgkin-Huxley equations. However, for a specific algorithm to detect coincidences on thin dendrites, additional understanding may be desirable. Such understanding may determine what is fundamental about two weights per input, what conditions cause its representational imperfections, what are the cellular rules for dendritic propagation, what are the learning rules for weight adjustment, and what is the energy efficient (logical reversibility) of the rules.

Some issues have been identified and addressed, in part, in previous inventions, such as in the invention of using prior and next weights. For example, U.S. Pat. No. 6,581, 049 to Aparicio et al., entitled "Artificial Neurons Including Power Series Of Weights And Counts That Represent Prior And Next Associations," which is incorporated by reference herein in its entirety, included the understanding that more than one weight per synapse may be required. As further developed in U.S. Pat. No. 7,016,886 to Cabana et al., entitled "Artificial Neurons Including Weights That Define Maximal Projections," which is incorporated by reference herein in its entirety, this prior-next representation was further understood as equivalent to matrix projections as defined by digital tomography. Further propagation and compression methods were further developed in U.S. Pat. No. 7,657,496 to Aparicio entitled "Nonlinear Associative Memories Using Linear Arrays Of Associative Memory Cells, And Methods Of Operating Same" ("Aparicio 2010"), which is incorporated by reference herein in its entirety.

Inspired to solve coincidence detection of thin dendrites, inventions have approached the representation of non-linear matrices within linear structures. With additional exploration in recent years for the now emergent interest in cognitive hardware, a complete answer to the dendritic storage of associative memories is now in hand.

Digital Tomography

Tomography is the process of reconstructing the image of an object by observing it in sections with a penetrating wave. For example, computerized tomography (CT) uses X-rays and magnetic resonance imagining (MRI) uses radio waves to image the body's interior. Rather than slice a living body to see inside its structure, different projections from different angles can be used to reconstruct its internal image.

Digital tomography does the same for binary objects such as for a binary matrix. Using two projections, one looking across the rows and another looking across the columns of the matrix, the objective is to "see" the individual bits in the interior of the matrix. Both projections, row and column, may be a vector of counts. Each count represents the number of intersecting bits of the row with all its columns or the intersection of a column with all its rows. Using such projections for an associative matrix, these two projections can be seen as two weight sets, one weight for each row and one weight for each column. In the case where the row labels are the same as the column labels in order to represent input-input auto-associations, each input label may have two weights, one in the row projection and one in the column projection.

However, these projections cannot perfectly represent the state of every matrix. To be perfect, the projections would need to be invariant, representing one and only one matrix configuration. As well known in digital tomography, only some projections are invariant, only for matrices that are "maximal", defined as a perfect packing of bits when the rows and columns are sorted.

Determining maximality may include sorting the rows and columns in projection order. If no holes are left in the packing, the matrix is maximal. If and only if the matrix is maximal, then the projections are invariant. This is to say that the two linear projections perfectly represent a maximal matrix and can be used to read any of its bits by comparing one projection to the index sort order of the other.

Reference is now made to FIG. 1, which is a graph illustrating using projections of a maximal matrix according to some embodiments of the present invention. For example, suppose input C (3002) had a row projection of 1 (3003) and H (3004) was sorted as the third largest column projection as index 3 (3006). From these two projections, we know that the CH association is not in the matrix because C's projection does not "reach" H. In contrast, imagine A (3008) having a row projection of 4 (3009) and F (3010) in column index order 1 (3012). In this case, A's projection length clearly reaches F as well as the three other column indices that follow.

Figure 2:
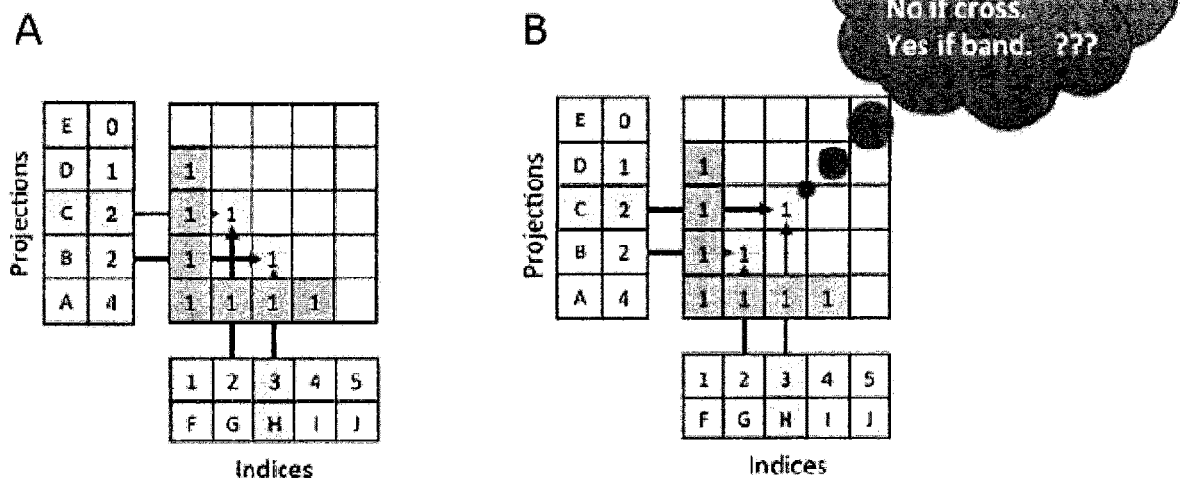
FIG. 2 is a graph illustrating a 4-switch problem using projections of a matrix according to some embodiments of the present invention.

In some embodiments, projections are a form of compression, but they are a lossy compression because very few matrices are maximal. Brief reference is now made to FIG. 2, which is a graph illustrating a 4-switch problem using projections of a matrix according to some embodiments of the present invention. The two projections can be used to approximate a matrix, but as the likely problem of some methods, the lossiness in representing more complex graph configurations will grow exponentially in larger dimensions. Turning again to digital tomography, the problem is known as the "4-switch" problem. The most elemental switch involves 4 cells in the matrix. Even with only 2 rows, A and B, and two columns, C and D, imagine the case in which all 4 projection weights are equal to 1. Each row is associated to one column (and visa versa), but it is impossible for the projections to distinguish the AC and BD configuration from that representing AD and BC instead.

The 4-switch problem of digital tomography is informative, but machine learning may provide a complimentary problem that allows a solution. In the context of digital tomography, the projections of the matrix are given, and the task is to imagine the matrix however it was constructed. In the context of machine learning, each association can be observed in training, with the opportunity to construct a matrix that has readable projections.

If the problem of switches can be detected and avoided, then there is the potential for matrix projections to perfectly learn and represent an association matrix. To solve this problem, the two variants of the 4-switch are referred to as "crossed" and "banded". Methods of using two weight projections and propagating the weights within a dendrite are here extended to perfect storage—when this distinction between crossed and banded switches can be made and detected. Specifically, the crossed form of the 4-switch is the problem. In this regard, the answer rests in avoiding crosses in the first place and then extending the activation rule to include higher banded, "longer distance" associations.

Simple Activations

A dendrite is a linear array of compartments with synaptic connections from other neurons. Each synapse contains a synaptic weight, defined as the strength of connection between the pre-synaptic and post-synaptic neurons. Synaptic weights grow through experience. Again described as cells that fire together, wire together, the coincidences of synaptic activity are reflected in the magnitude of this connection weight.

To represent two projections as two weights per input, a first weight represents the typical synaptic activation strength while a second weight represents the receptivity of each dendritic compartment to other activations. One synapse and one compartment are assigned to each input in this idealized dendritic structure.

The physiology of neural signaling by the Hodgkin-Huxley equations describes the voltage difference between intra-cellular and extra-cellular ionic concentrations and the movement of ions in and out of the cell to account for the neuron's membrane potential. Signal propagation is by depolarization of this membrane potential. Resting synaptic and receptivity weights are idealized as intra-cellular potentials, following the convention of setting the external side of the membrane as the resting voltage zero-point. When activated, these weights depolarize to become external to each synapse and compartment as extra-cellular weights.

Figure 3:
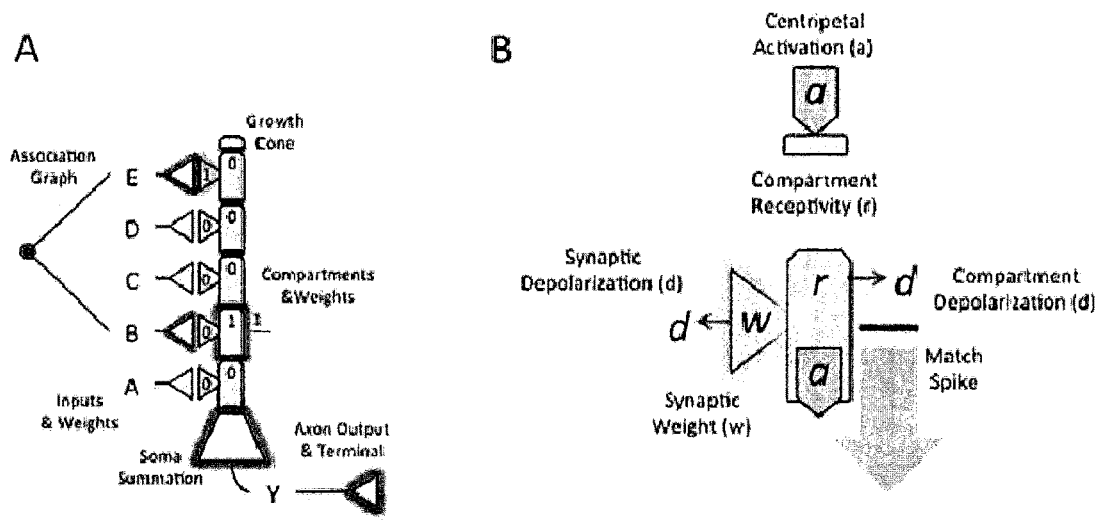
FIG. 3 is a schematic diagram of a dendrite according to some embodiments of the present invention.

Reference is made to FIG. 3, which is a schematic diagram of a dendrite according to some embodiments of the present invention. The dendrite is directionally activated from the apex, from the distal tip of the dendrite, down to the soma, which is the neuron's body. The soma is understood to be a summation point for the neuron's activity, which the axon can transmit to other neurons. Although back-propagating signals also exist in real neurons and can be included herein, coincidence detection is computed by distal synapse activation that flows through each more proximal compartment on its way to the soma. As will be defined, coincidence detections generate a dendritic action potential, a spike, which travels toward the soma for its summation of such coincidences across the entire neuron.

Synapses and compartments can be active or passive, positive ON or negative OFF, depending on whether the pre-synaptic input signal is ON or OFF. Synaptic activation of each active synapse travels down the dendrite across the receptivity gradient. When the positive activation encounters a positive receptivity, the two non-zero weights match each other, generating a spike. If matched, both the activation wave and the receptivity gradient are decremented to account for the found association, and the decremented activation proceeds to the next compartment.

This simple propagation rule can detect contiguous runs of associations within the neighborhood of the activated synapse and non-zero contiguous propagations to associations farther afield. For example, the schematic above shows an EB association. Imagine the association EB when it is the only association in the dendrite and all other synaptic and compartment weights set to 0. When E and B are both active, a synaptic weight of 1 will propagate unimpeded (no decrement) until it reaches the other's compartment and receptivity of 1. The activation and receptivity match and will both decrement to zero. There are no other associations to be found. This example is trivial but the method extends to larger association blocks—except for the problem of 4-switches.

Bandwidth Reduction

Similar to projection sorting in digital tomography to detect and exploit maximal matrices, this activation rule benefits by sorting the matrix inputs so that each input is as close as possible to its associated other inputs. Such sorting may be equivalent to matrix bandwidth reduction. A low bandwidth matrix is a sparse matrix that has its bits packed toward the diagonal. High bandwidth is defined to the degree that bits remain far away from the diagonal.

Figure 4A:
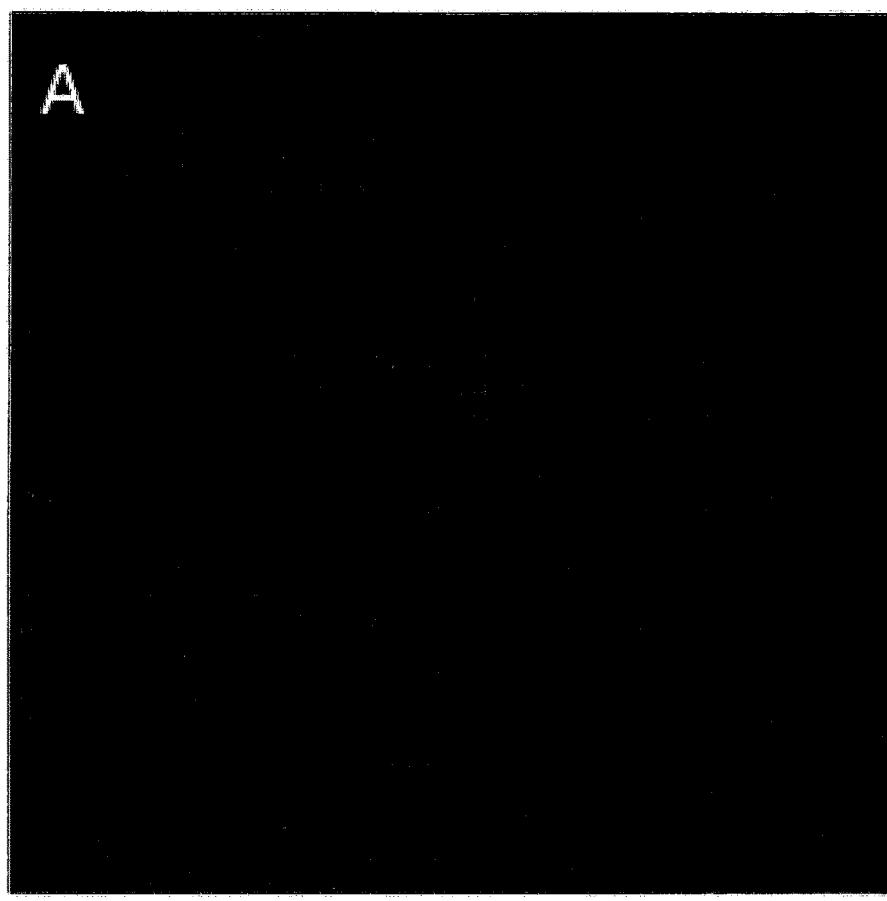
FIGS. 4A and 4B are graphs representing all coincident pairs in a matrix City:Tampa in the context of "Tampa" from unstructured new sources when rows and columns are in an arbitrary order and a sorted order, respectively.
Figure 4B:
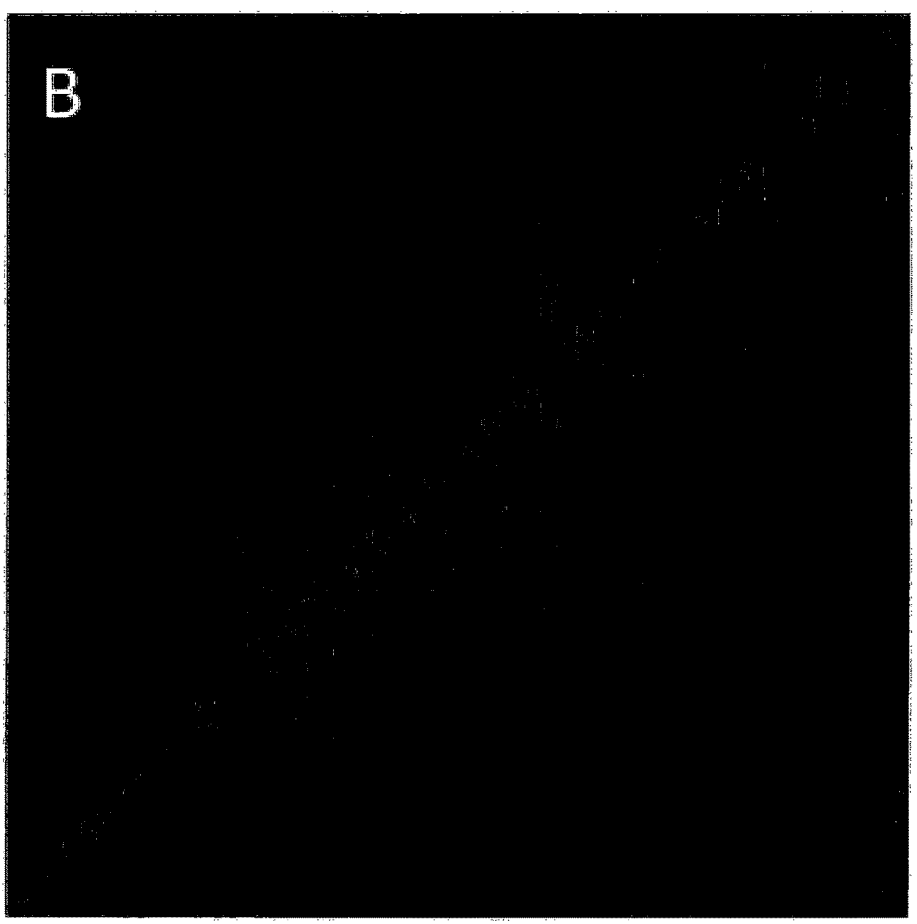

Brief reference is made to FIGS. 4A and 4B, which are graphs representing all coincident pairs in a matrix City: Tampa in the context of "Tampa" from unstructured new sources when rows and columns are in an arbitrary order and a sorted order, respectively. As illustrated in FIG. 4A, when rows and columns are in arbitrary order, the association cells are widely distributed. In contrast, as illustrated in FIG. 4B, when the rows and columns are sorted to minimize matrix bandwidth, associated inputs move closer to each other, placing their associations closer to the diagonal as well.

For the activation rule across a dendrite, bandwidth reduction tends to pack associations into contiguous, local blocks. Similar to reading a matrix by seeing if its projection length of one input "reaches" the index of another input in digital tomography, an activation wave detects its associations, decrements itself, and continues to find associations down the line. Sorting benefits this local propagation technique by creating more local input-input associations.

It should be clear that this dendritic propagation technique can read an association without an explicit wire between each and every input pair. The "wires" are virtual between any two input compartments and are expressed only by activation propagation. Because the time to propagate to another between inputs is proportional to the distance between them, matrix bandwidth minimization allows the virtual wires to also become "shorter" as well as virtual.

Cascading Activations

It may be useful to represent a perfect memory of any graph, including associations between two synapses that might be otherwise confounded by a 4-switch even after bandwidth reduction. Simply being farther away is not the problem. In general, the simple activation rule just described can detect certain coincidences that are not necessarily continuous. However, higher band associations also tend to live within 4-switches. For example, other associations that might come between E and B in a more complex and interesting graph, could "get in the way".

Figure 5:
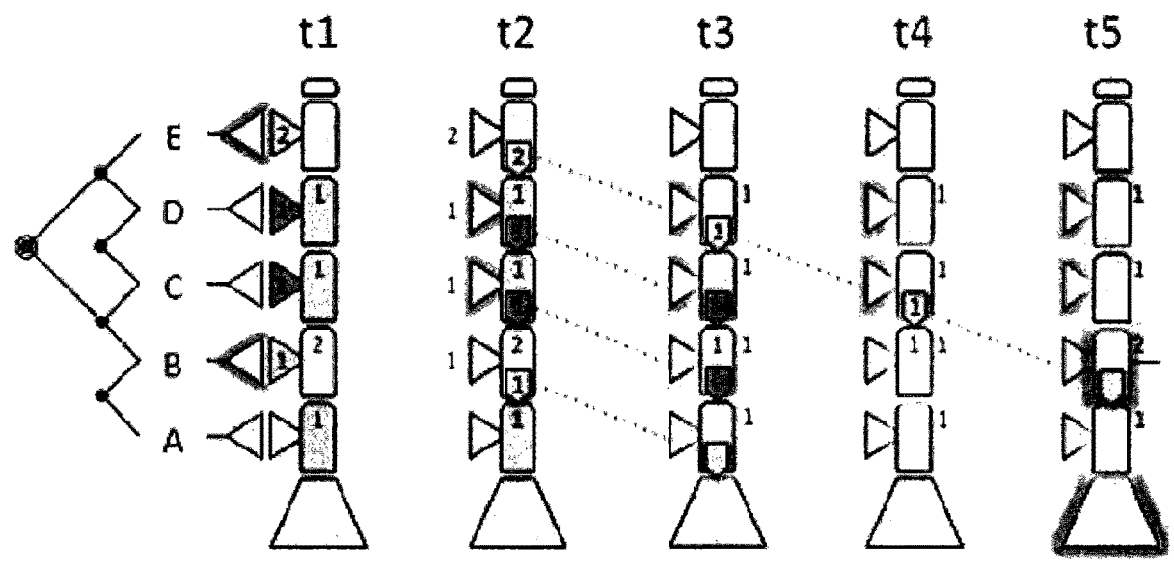
FIG. 5 is a schematic diagram of cascading activations of a dendrite according to some embodiments of the present invention.

Reference is made to FIG. 5, which is a schematic diagram of cascading activations of a dendrite according to some embodiments of the present invention. A solution may be found in the parallel, cascading propagation of many waves. In addition to the activations generated by active inputs, non-activated weights also propagate ahead of the positive activations to "clear the way". This cascade can perfectly represent any graph of near and far associations across the dendrite—so long as there are no 4-switches in the crossed configuration. Otherwise, so long as all 4-switchs are "banded", both high and low band associations can be detected across a cascading bands.

For an example of a banded 4-switch, assume again that E and B are associated to each other, also with D and C associated between E to B. Using only a single propagation wave as described above, if E and C were ON, E's positive activation would encounter C's positive receptivity before reaching its true associative receptivity at B. This is the problem of 4-switches, no matter if in the crossed or banded configuration. However, if D propagates in a lower bandwidth cascade before E, then the D activation wave will correctly match C's receptivity, clearing the way for the E wave on the higher band to proceed to its true connection with B.

This central idea may be stated differently, namely that cascading propagation can be seen as processing the lower bands before traveling to the higher bands. Cascading propagation of all synaptic weights may be required to "clear" the lower-band associations so that higher-band activations can "follow" to their more remote target associations.

Figure 6:
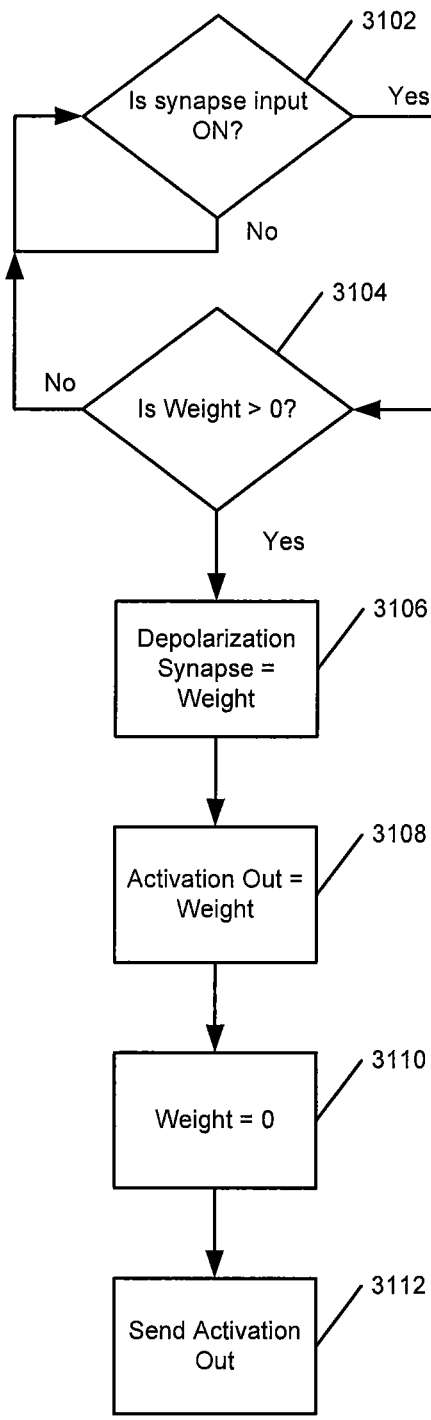
FIG. 6 is a flow chart illustrating the synaptic depolarization whenever the synapse is turned ON, including the activation signal to the next compartment according to some embodiments of the present invention.

For any graph to be presented without loss, non-active synapses must also propagate their synaptic weights for a full accounting. To distinguish positive input activation waves from these additional waves, each activation must carry its positive or negative sign. In other words, the level of activation is based on the synaptic weight, while the sign of the activation is based on whether the originating synapse is ON or OFF. Reference is now made to FIG. 6, which is a flow chart illustrating the synaptic depolarization whenever the synapse is turned ON, including the activation signal to the next compartment according to some embodiments of the present invention. When the synapse input is turned on (block 3102), then a determination is made as to whether the weight is greater than 0 (block 3014). If the weight is greater than 0, then the depolarization synapse value is set to the weight value (block 3106). Then the activation output is set to the weight value (block 3108) and then the weight value is set to 0 (block 3110). Then the activation output is sent (block 3112).

In order for the OFF synapses to also propagate, any activation from more distal compartments forces additional synaptic depolarizations and activation waves. This occurs once per compartment, if not already depolarized (the intracellular potential is not 0). When these OFF synapses are activated, the propagation is also equal to the synaptic weight as with ON synapses, but the sign is negative.

Figure 7:
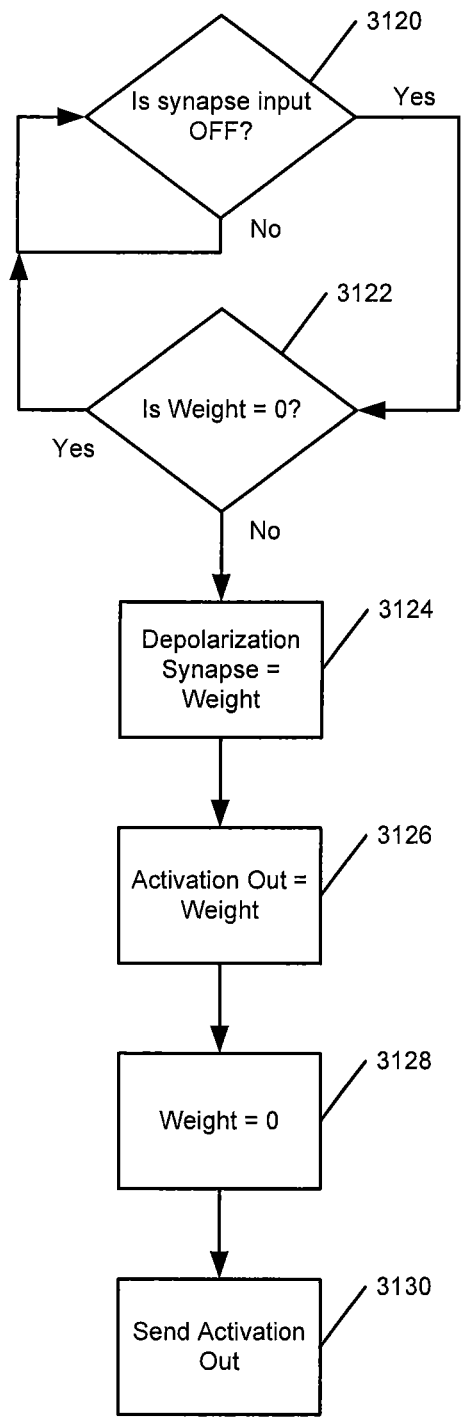
FIG. 7 is a flow chart illustrating the cascading synaptic activation according to some embodiments of the present invention.

Reference is now made to FIG. 7, which is a flow chart illustrating the cascading synaptic activation according to some embodiments of the present invention. When the synapse input is turned off (block 3120) and the weight is not equal to 0 (block 3122), then the depolarization synapse value is set to the weight value (block 3124). Then the activation output is set to the weight value (block 3126) and the weight value is set to 0 (block 3128). Then the activation output is sent (block 3130). As all the input activations are initiated and begin to cascade, the compartments respond to a series of activations flowing over them as they move down the dendrite.

If every compartment, ON or OFF propagates its signal, then this is correct for OFF inputs. However, in some embodiments, OFF inputs may be triggered only when an ON signal impedes on them. Stated differently, rather than all OFF compartments activating, only those that will be engaged in other ON propagations need to clear themselves out first.

Figure 8:
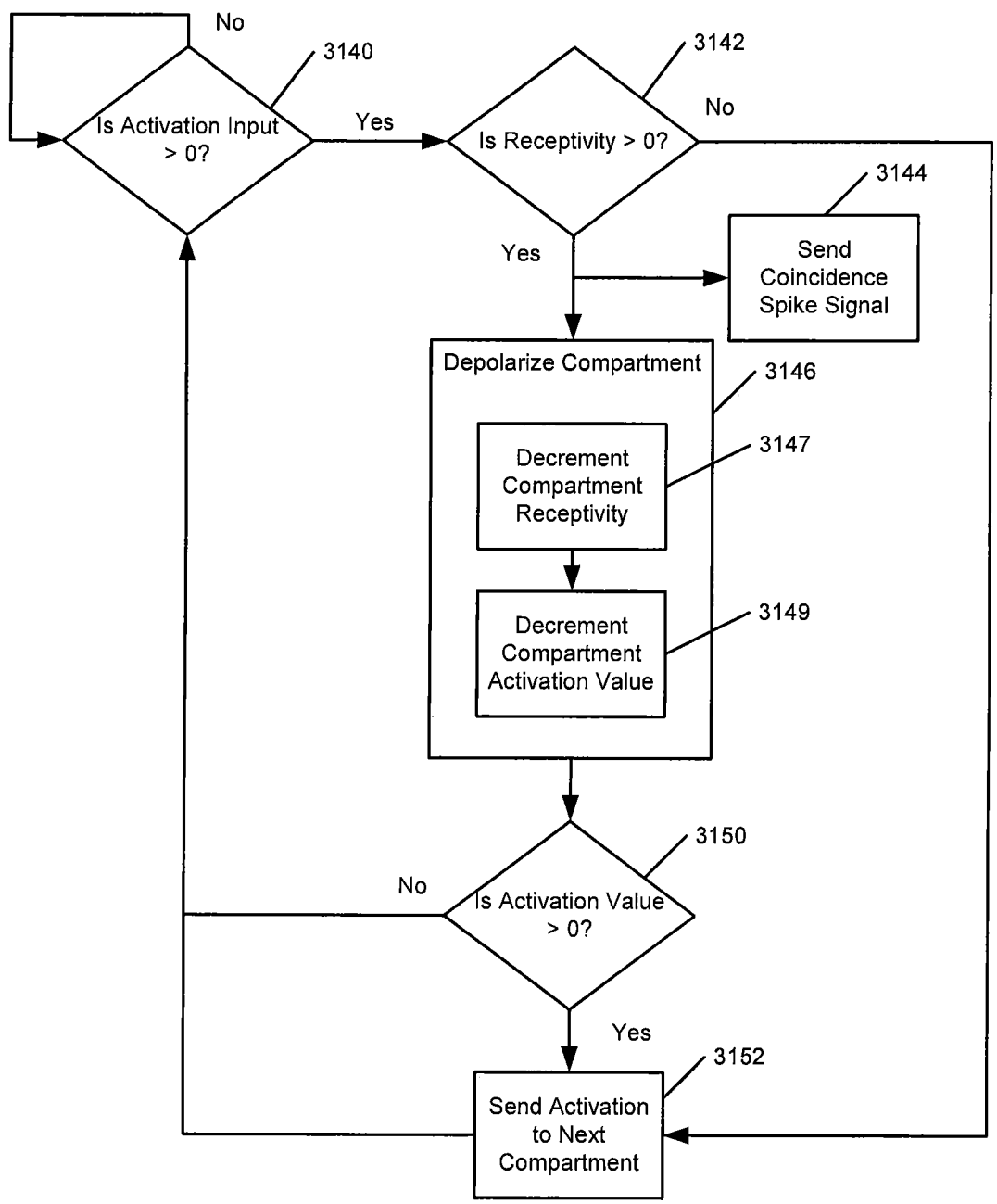
FIG. 8 is a flow chart illustrating the logic for processing a cascading compartment activation according to some embodiments of the present invention.

Reference is now made to FIG. 8, which is a flow chart illustrating the logic for processing a cascading compartment activation according to some embodiments of the present invention. Activations are propagated only as they continue to be non-zero. As such, if the activation input is zero, then no activation propagation occurs (block 3140). When receptivity decrements to zero, the compartment becomes un-responsive except to pass the activation from one compartment as its own activation to the next compartment. If the activation input is greater than zero (block 3149) but the receptivity is zero (block 3142), then the activation is sent to the next compartment (block 3152).

For additional efficiencies, latching between compartments can become transparent when receptivity drops to zero. Compartments that have no further receptivity have nothing left to do, and can electrotonically transmit the input activation as their output activation without sequence latching. In other words, they do not need to keep passing activations in a bucket brigade. For instance, imagine 1000 connected compartments that have exhausted their receptivity to 0. Any input activation to the $1^{st}$ compartment can immediately become the exact same output activation of the $1000^{th}$ compartment. These bypassed compartments can become transparent, simultaneously passing the non-zero activation value across long distances in one operation. As a result, the number of time steps required to compute the graph is not a function of compartment distances and the time steps for propagation. The effect is that lower-band, closer associations will quickly clear and drive receptivity to zero. Longer and longer zero-receptivity chains will form to electrotonically transmit the higher band associations over longer distances in shorter time. As a result, the time to detect associations is a function only of a matrix's bandwidth rather than a dendrite's length.

A non-zero activation meeting a non-zero receptivity accounts for an association. But to detect coincidences between only the inputs that are ON, a positive activation wave must meet a positive input to the current compartment. When both are positive, a match is detected and signaled as a coincidence spike to the soma. As such, if the activation input (block 3140) and the receptivity (block 3142) are both greater than zero, then a coincidence spike signal is sent to the soma (block 3144).

Additionally, when each compartment receives a non-zero activation signal (block 3140) and the receptivity is also non-zero (block 3142), then the compartment further depolarizes (block 3146). Compartment depolarization (block 3146) may include decrementing the compartment receptivity (block 3147) and decrementing the compartment activation value (block 3149). If the activation remains non-zero (block 3150), then the compartment sends the remaining activation to the next compartment (block 3152). Some embodiments provide that the compartments are latched to each other in the sense that each compartment may propagate its own synaptic activation before accepting and processing a more distal activation and then the next distal activation in sequence.

This representation of matrix associations as projections allows the crossbar wires to be virtual. These virtual wires can be made shorter by matrix bandwidth reduction, as described above. And whether sorted or not, long distance "wires" become shorter still by the growing transparency of compartments during propagation.

The cascading activation rule may be used to compute any associative matrix so long as it does not contain any 4-switches in the crossed configuration. As such, the learning rules must avoid adding any crosses to the matrix in the first place.

Figure 9A:
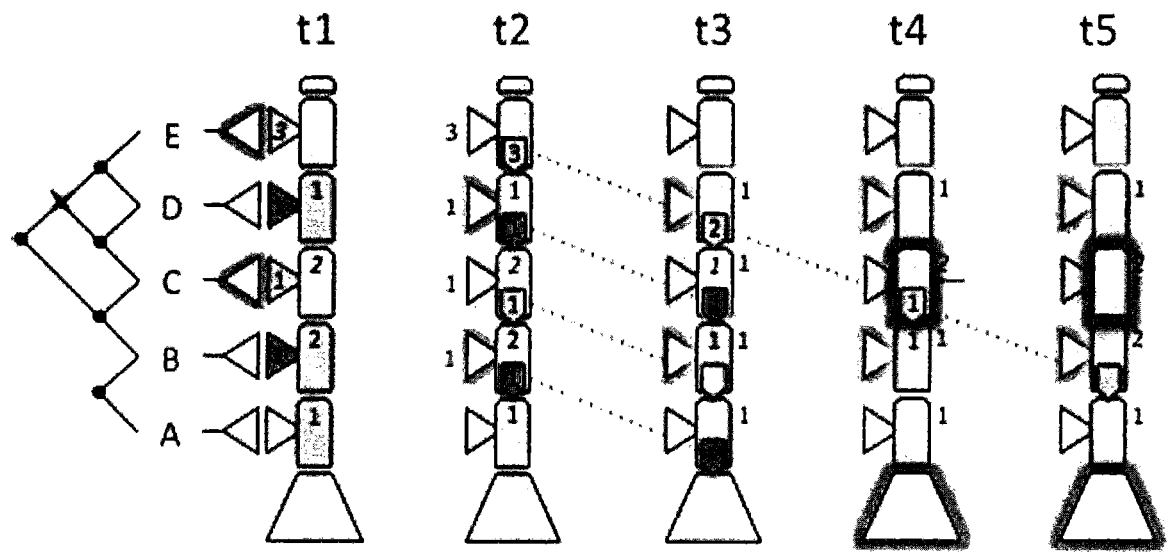
FIG. 9A is a schematic diagram of cascading activations of a dendrite according to some embodiments of the present invention.

Brief reference is now made to FIG. 9A, which is a schematic diagram of cascading activations of a dendrite according to some embodiments of the present invention. A basic "storage prescription formula" for an associative matrix may provide that if two inputs are coincident, their associative weight is incremented. For example, if E and C are to also be stored in a given matrix-graph, then E and C weights are incremented. As each input has two weights, the formula becomes directional, depending on whether E is distal (farther from the soma) or proximal (nearer to the soma) than C. To learn an association between two inputs across a dendrite, the distal input increases its synaptic weight, which will propagate down the dendrite, while the proximal input increases its receptivity weight, which will match the other's propagation. To load such a new association, the new weights may be "imagined" to increment, to see if the inputs "find" each other. If the additional association (or more than one in a vector input pattern) does not create a crossed 4-switch, the incremented weights will correctly assimilate into the virtual graph.

The learning rule represents a triplet dependency. First, the target neuron is assumed to be ON in order to load new associations within its context. Second, a distal activation propagates an ON input signal. Third, this distal signal interacts with the more proximal activation of another input signal. While there is growing evidence for triplet STDP, spiking is not always required and pairwise STDP is variable in leading to potentiation. Physiological evidence leans toward more general methods of activation, spiking or not, for the stronger requirement of triple activation.

Figure 9B:
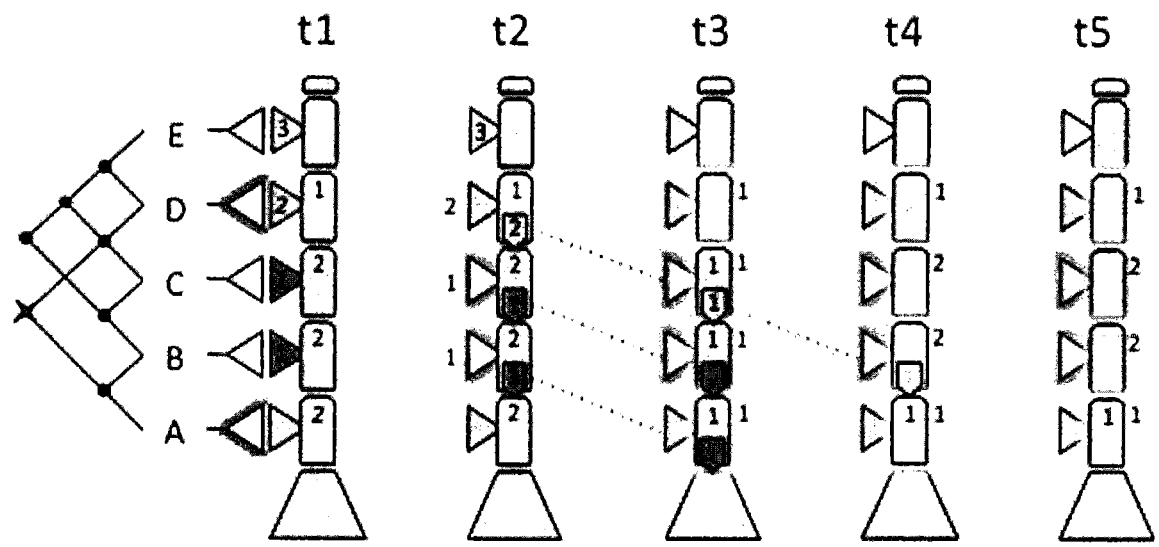
FIG. 9B is a schematic diagram of cascading activations of a dendrite according to some embodiments of the present invention.

However, if any association creates a crossed configuration, subsequent propagations will not correctly express the new association. Brief reference is now made to FIG. 9B, which is a schematic diagram of cascading activations of a dendrite according to some embodiments of the present invention. As illustrated, if D is distal and A is proximal and connecting them creates as 4-switch, then D's propagation will be incorrectly received before reaching A. This problem is apparent when A is left "standing at the altar" (so to speak), waiting for D to arrive. Any such error is due to the creation of a 4-switch.

Figure 10:
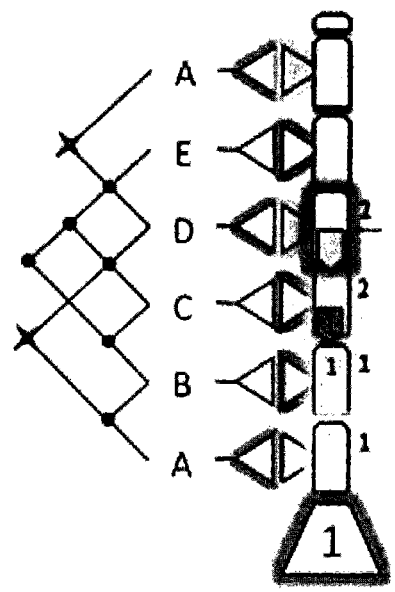
FIG. 10 is a schematic diagram of cascading activations of a dendrite according to some embodiments of the present invention.
Figure 10:
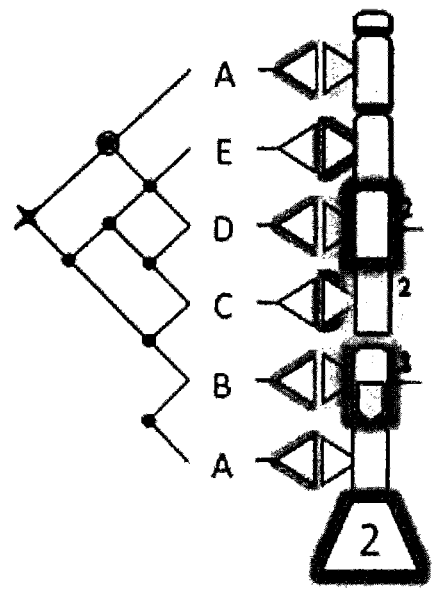

The new DA association cannot be directly loaded into the given projection weights, but several methods can add the associations in other ways. Brief reference is now made to FIG. 10, which is a schematic diagram of cascading activations of a dendrite according to some embodiments of the present invention. As one method, the dendrite can grow at its apex, which includes a "growth cone" in real neurons. More generally for hardware, a longer array of compartments is assumed to include unused free space. Adding another synapse and testing its association to other synapses can more likely add the new association to the new synapse. More generally, crossing associations can be avoided by placing them on another dendrite (or extended free space); if the associations can be stored elsewhere, store it elsewhere.

To be clear, no claim is made that an $O(N^2)$ object can always be represented in two $O(N)$ projections. For more complex graph structures, duplicate synaptic inputs may be required. For example, Peterson Graphs (sometime called "snarks") at higher dimensions may include crossed configurations that cannot be reduced to an $O(N)$ configuration of two projections. But in one longer linear dendritic array or a parallel set of such arrays as in a dendritic tree, all associations can be loaded at one place or another in the representation. It is generally assumed that input axons may make more than one connection over the field of the post-synaptic neural tree.

Real synapses are also known to connect, disconnect, and move on the dendrite, in minutes to hours. So long as the associations can be loaded before they are lost, reorganizations can follow to reduce synaptic duplication and regain more wiring efficiency.

Real neural systems are also extremely energy efficient. The entire brain is known to expend only 10-20 W of energy, equivalent to a utility light bulb, spread across trillions of neurons in the human brain. The representation of projections may offer an astounding compression of associations within a "thin" dendritic space. Although cascading propagation is sequential, computation speed is a function of matrix bandwidth when accelerated by electrotonic "jumps" for far-field connections. More fundamental energy efficiency also seems possible.

Adiabatic processes are defined as minimizing the loss of physical energy. In electronics, adiabatic circuits are being developed to minimize the energy cost of computers, a problem particularly important to mobile and embedded computing devices. Whether a circuit is adiabatic or not is very dependent on its specific design (such as never passing reverse current through a diode). This property may also depend on whether the operation is logically reversible. A NOT gate is reversible because the input can also be computed from its output. An XOR gate is not reversible because two different input states lead to the same output. Given only the output, the input information to an XOR gate is lost. When information is lost, energy is also lost.

Figure 11:
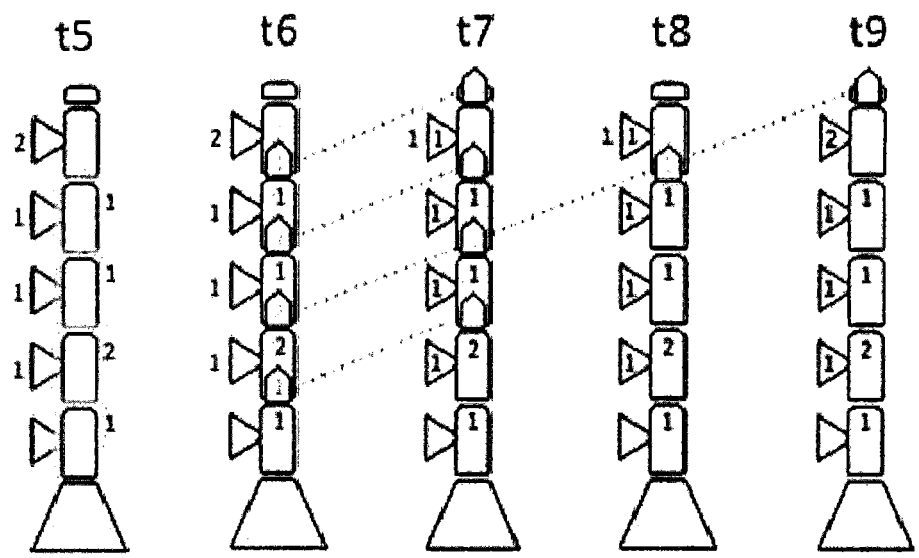
FIG. 11 is a schematic diagram of logically reversing cascading activations of a dendrite according to some embodiments of the present invention.

Brief reference is now made to FIG. 11, which is a schematic diagram of logically reversing cascading activations of a dendrite according to some embodiments of the present invention. Embodiments of coincidence detection on thin dendrites is described here at the computational and algorithmic level of analysis rather than its implementation in any specific electronic circuit design. But as a computation, adiabatic efficiency of embodiments may be questioned in terms of its logical reversibility. One test of logical reversibility is whether the end state of a cascading propagation can be reversed to regain the start state.

This appears to be true by a reverse propagation in which the depolarized synaptic and receptivity weights continue to represent the original two projection vectors. The end state is perfectly isomorphic to the start state. Reversible circuits must have input-output symmetry in the same number of input as output wires. Given that the polarized weight vectors are identical to the depolarized versions, logical reversibility is true by reason of non-variance. For example, there is a one-to-one correspondence between the projection state and itself (the polarized and depolarized identity).

Reversibility may also be proven if the computation can be run in reverse so that the output always produces the original input. If the depolarized receptive weights were to repolarize and generate a reverse wave that back propagates to match the depolarized synaptic weights, the propagation algorithm can be run in reverse. Coincidence detection on thin dendrites is a one-dimensional cellular automata in that each compartment has no more than two neighbors.

While logical reversibility is a more profound property of these approaches, a reversed "back propagating" signal completes the learning rule for triplet dependencies. For two inputs to associate, both of their compartments must update their weights. As described above, the weight updates are asymmetrical: an association updates the distal synaptic weight and the proximal receptivity weight. Given the activation of the post-synaptic neuron, the orthodromic propagation (toward the soma) matches the distal activation to a proximal activation. This is sufficient to update the receptivity weight of the proximal compartment. Reversibility is not only adiabatic; it also provides an antidromic propagation (away from the soma) to match the proximal activation to the distal activation. In the reverse case, the update is recorded in the synaptic weight of the proximal compartment. The logic of the learning rule is also reversed, but it again may require a triple dependency.

In some embodiments, the coincidence learning and detection algorithm can be improved based on understanding that a single neuron is non-linear unit and is networks in itself. The pyramidal neuron of the neocortex may be hypothesized to implement such methods within their thin dendrites. While the pyramidal neuron may be the centerpiece of the cortical microcolumn, other neural types may surround pyramidal cells to form a larger circuit. The circuit may contain many different cell types, including many types of inhibitory neurons.

Functionally, there are many types of inhibition. For example, inhibition at the base of the soma, the point of activity summation from dendrites and output to the axon, may act as a "veto" controller. As such, no matter a neuron's own "vote", strong inhibition at this output point can limit any output. Another type of inhibition is called "sculpting inhibition". Rather than an overall veto power, sculpting inhibition may be thought to more surgically modify the activity of another neuron.

Inhibition can evolve the given algorithm, in the same way inhibitory neurons may be "late invaders" to the cortical circuit during development. In some embodiments, inhibition can "blanket" the pyramidal neuron in order to sculpt it. One inhibitory neuron of the cortical circuit is referred to as the "double bouquet" neuron and is potentially most relevant due to its location, shape and connectivity. The double bouquet neuron sits next to the pyramidal neuron, is shaped into a thin column of dendrites that may be parallel to the pyramidal cell, and may innervate itself across the extent of the pyramidal cell.

Figure 12:
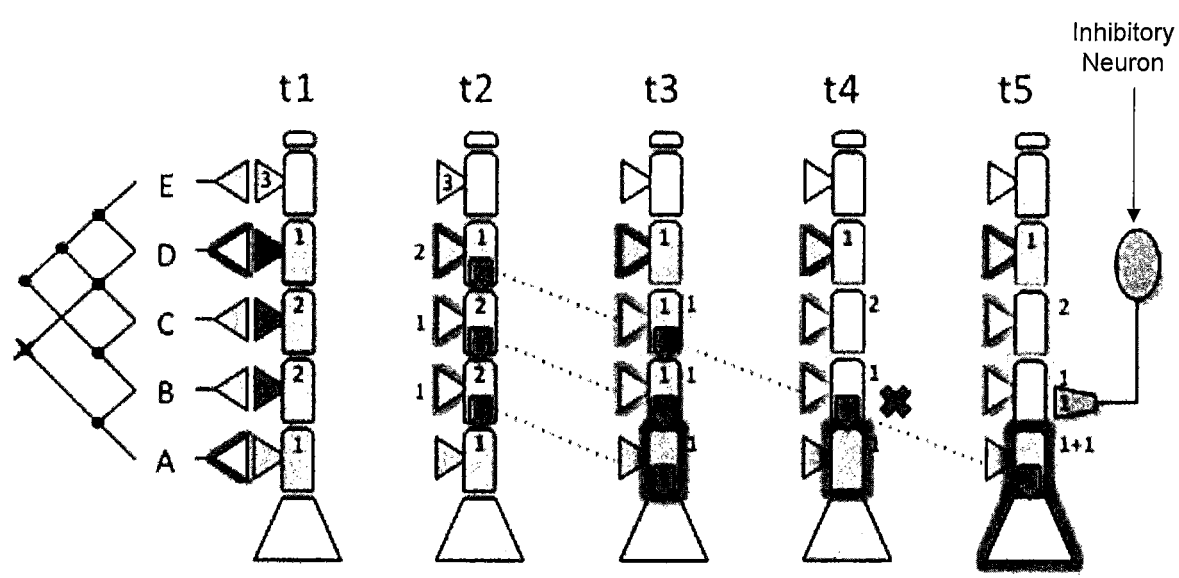
FIG. 12 is a schematic diagram of detection and representation of the crossed configuration when an inhibitory neuron's inhibitory synapse is ON in a dendrite according to some embodiments of the present invention.

Computationally, such inhibition might play a role in further addressing the 4-switch problem. For example, reference is now made to FIG. 12, which is a schematic diagram of detection and representation of the crossed configuration when an inhibitory neuron's inhibitory synapse is ON in a dendrite according to some embodiments of the present invention. As illustrated, the DA association may be loaded as discussed before and which was disallowed in forming a crossed 4-switch with the BE association. The DA association can be loaded elsewhere on the dendrite or another branch of the dendritic tree. Reorganization of synapses might also remove the switch, but this may take more time. As an additional technique for addressing crossed configurations, an inhibitory connection (from the red inhibitory neuron) at synaptic input B could detect that B will erroneously associated to D and form an inhibitory signal. By inhibiting B from matching D's activation, the propagation of activity from D would pass B to correctly match with A.

The algorithm for such detection and how the inhibitory signal "skips" an activation-receptivity match is an extension of the basic cascading algorithm and is not required for a dendrite to represent and express any graph. However, it does show that larger circuit computation is possible, such as to represent more complex graph configurations than the dendrite alone.

Other extensions of the techniques herein include the representation of a weighted graph. In other words, the synaptic and receptivity weights currently represent the number of associations from one input to the others. An extended design may also represent the strength of each association through a power series of weights for each input to account for the connection strengths, using separate synapse and compartment weights for each power level. Power weights can be separated across different dendrites, one dendrite for each power. A power series of synapses can also be made co-local on one dendrite, one synapse for each power weight, co-local to their common input. Physiologically, synapses are understood to grow not just in strength but also in morphological structure to include separate transmission sites within a multi-synaptic bouton.

The understanding of memory as the fundamental knowledge representation of the brain further necessitates an understanding of the fundamental unit of computation, the neuron, and how it supports components of cognitive representation, namely connections, strengths of connections, and context of connections.

Some embodiments provide that connections may be considered the fundamental element of neural representation, which is implemented by synaptic links from one to another. In some embodiments, strengths of connections may also be fundamental in representing the statistical magnitude of these connections. Some embodiments provide that context of connections and strengths is also be represented as triple stores, which are a 3-space presentation of connections and their strengths.

In order to represent semantic knowledge, such as in the subject-verb-object structure of all human language, connections are provided at the level of "triples", not just a pair-wise graph. For statistical knowledge as well, conditional information "lives" beyond the assumption of independent variable inputs to each dependent variable output. Because each neuron represents input-input associations mapped to an output, each neuron can represent such contextual and conditional triples, collecting forming larger networks.

The brain may be considered as a network of networks of associative memory networks. The brain organization levels may be considered as the brain overall, area microcircuits, and individual neurons. Regarding the brain overall organization, the brain is not a mishmash of spaghetti. Instead, it is composed of many subareas, which are separate but communicate with each other as one overarching network.

At the area microcircuit organization level, within each area of the brain, connections may be designed to address specific functions within the larger network. The most fundamental network is at the neuron level, within each neuron. Thus, in contrast with simplistic linear summing and threshold models, each neuron may represent a nonlinear associative matrix, connecting inputs to each other.

All three of these properties have been described already in commonly owned U.S. Pat. No. 8,352,488 to Fleming et al., U.S. Provisional Patent Application No. 61/896,258, filed Dec. 28, 2013 to Hofmann et al., and U.S. Provisional Patent Application No. 61/904,835, filed Nov. 15, 2013 to Hofmann et al., all of which are incorporated by reference as if set forth entirely herein. They describe how massive numbers of matrices can be distributed, parallelized, compressed, and recollected on today's general purpose computing clusters. Compressing such matrices and aggregating results across matrices and submatrices has been solved using software algorithms and special forms of distributed hash coding, variable length integer, and zero-run length encoding.

However, the constraints of current von Neumann bottlenecks, such as the separation of computation and memory, are far from the ideal of neural efficiency. For example, the "semantic expansion rate", the scaling cost of graph stores, can be notoriously larger than data itself. Currently available software cannot compare to how our brains must have a better representation when computing with neural devices. Therefore, in the same way that transistors/area defined the battleground for smaller and smaller microelectronics, triples/area may become the mark of smarter and smarter neuromorphic computing. To that end, the embodiments described herein emulate the more efficient algorithm found in neurons.

The growing interests in cognitive computing and neuromorphic hardware are generally defined as "brain-like" and "neuron-like". Drawing inspiration from our own minds and brains is becoming the basis for more intelligent machines. The brain evolved to deal with the real world in real time, also learning in real time as the world changes. While these capabilities may be fundamental to intelligence, they have been fundamentally different from conventional artificial intelligence systems, for which knowledge engineers must author facts, and from classical statistics, for which data scientists must build data models. In contrast, embodiments described herein have been focused on associative memories as the true basis of knowledge. When psychologists speak of semantic memory, procedural memory, episodic memory, and motor memory, the function of "memory" is seen as common to all natural reasoning. Associative memories satisfy the "single algorithm hypothesis" that underlies how we think and behave and how computers can do the same.

As described herein, the natural intelligence of our own minds and brains are represented using associative memory representation and reasoning and, whether in software or hardware, assume a matrix orientation. However, the hardware algorithms have been pursued to represent matrices within linear structures, inspired by the goal of understanding "coincidence detection of thin dendrites" for ultimate efficiency. The accounting of cascading propagations and avoidance of associative crossings has now achieved an improved memory representation. As such, significant increases in computer efficiencies may now be realized.

Cognitive computing will continue to require an understanding of real intelligence. Although not all definitions include "brain-like" aspirations, most admit that our brains represent the best-known way to survive in real-time in a dynamic real world. Graph representations are increasingly being accepted as the universal representation of knowledge to connect people, places, and things, situations, actions, and outcomes. Therefore, graph representation and reasoning will become increasingly central to computing in general, and as such will move into cognitive operating systems and cognitive hardware fabrics of the near future. Neurons offer the inspiration for how graphs can be ultimately compressed, quickly expressed, and operated with low energy in neuromorphic computers.

In the same way that 1s and 0s are the fundamental elements of digital computing, the connections and counts of synapses will define cognitive computing, equally broad in all the applications that this new form of computing will support.

Some embodiments are directed to a computer program product comprising a computer usable storage medium having computer-readable program code embodied in the medium, the computer-readable program code comprising computer-readable program code that is configured to perform operations of the systems and methods herein.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A computer system comprising an artificial neuron, the artificial neuron comprising:
   a plurality of dendrites, ones of which include a plurality of dendrite compartments, wherein a respective one of the dendrite compartments is uniquely associated with a respective one of a plurality of inputs, each dendrite compartment comprising a first weight value corresponding to a synapse activation strength and a second weight value corresponding to receptivity of the respective dendrite compartment to other activations;
   wherein the plurality of dendrite compartments are linearly arranged from an apex that is a distal tip of the dendrite to a soma at a proximal end of the dendrite;
   wherein dendrite compartments having second weight values of zero are configured to electrotonically transmit an activation input from a more distal one of the plurality of dendrite compartments as an activation output to a more proximal one of the plurality of dendrite compartments, wherein to electronically transmit the activation input comprises to immediately transmit the activation input without sequence latching;
   wherein responsive to the first weight value in one of the plurality of dendrite compartments being greater than zero and the second weight value in the one of the plurality of dendrite compartments being greater than zero, the one of the plurality of dendrite compartments sends a coincidence spike signal to the soma that is an artificial neuron summation point.

2. The computer system according to claim 1, wherein each of the plurality of dendrites is a linear array of the dendrite compartments that are configured to receive inputs from respective other artificial neurons.

3. The computer system according to claim 1, wherein ones of the plurality of inputs are received via cascading synaptic activation via the plurality of dendrite compartments.

4. The computer system according to claim 1, wherein responsive to the plurality of inputs generating a crossed-switch among ones of the plurality of dendrite compartments, the corresponding one of the plurality of dendrites includes an added dendrite compartment at the dendrite apex.

5. The computer system according to claim 1, wherein responsive to the first weight value in one of the plurality of dendrite compartments being zero, activation propagation ceases for that one of the plurality of dendrite compartments.

6. A computer system comprising an artificial neuron, the artificial neuron comprising:
   a plurality of dendrites, ones of which include a plurality of dendrite compartments, wherein a respective one of the dendrite compartments is uniquely associated with a respective one of a plurality of inputs, ones of the plurality of dendrite compartments configured to receive a cascading activation and to transmit the cascading activation in an unmodified state if the corresponding one of the plurality of dendrite compartments includes a first receptivity value and in a modified state that is different from the unmodified state if the corresponding one of the plurality of dendrite compartments includes a second receptivity that is different from the first receptivity;

wherein the plurality of dendrite compartments are linearly arranged from an apex that is a distal tip of the dendrite to a soma at a proximal end of the dendrite;

wherein dendrite compartments having receptivity values of zero are configured to electrotonically transmit an activation input from a more distal one of the plurality of dendrite compartments as an activation output to a more proximal one of the plurality of dendrite compartments, wherein to electronically transmit the activation input comprises to immediately transmit the activation input without sequence latching;

wherein ones of the plurality of dendrite compartments are further configured to send a coincidence spike signal to the soma that is an artificial neuron summation point responsive to a synapse activation strength value in a respective one of the plurality of dendrite compartments being greater than zero and the first receptivity value in the one of the plurality of dendrite compartments being greater than zero.

* * * * *